United States Patent
Akabane

(10) Patent No.: US 10,062,827 B2
(45) Date of Patent: Aug. 28, 2018

(54) THERMOELECTRIC MODULE

(71) Applicant: KYOCERA Corporation, Kyoto-shi, Kyoto (JP)

(72) Inventor: Kenichi Akabane, Kirishima (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 56 days.

(21) Appl. No.: 14/899,080

(22) PCT Filed: Jul. 25, 2014

(86) PCT No.: PCT/JP2014/069663
§ 371 (c)(1),
(2) Date: Dec. 16, 2015

(87) PCT Pub. No.: WO2015/045602
PCT Pub. Date: Apr. 2, 2015

(65) Prior Publication Data
US 2016/0133815 A1    May 12, 2016

(30) Foreign Application Priority Data
Sep. 27, 2013    (JP) ................. 2013-200947

(51) Int. Cl.
*H01L 35/32* (2006.01)
*H01L 35/18* (2006.01)
*H01L 35/02* (2006.01)

(52) U.S. Cl.
CPC .............. *H01L 35/32* (2013.01); *H01L 35/02* (2013.01); *H01L 35/18* (2013.01)

(58) Field of Classification Search
None
See application file for complete search history.

(56) References Cited

U.S. PATENT DOCUMENTS

| 3,456,803 A | * | 7/1969 | Rak | ...................... B01D 61/025 |
|---|---|---|---|---|
| | | | | 210/177 |
| 4,290,080 A | * | 9/1981 | Hysell | ................ H01L 21/4871 |
| | | | | 204/192.25 |

(Continued)

FOREIGN PATENT DOCUMENTS

| JP | 10-270762 A | 10/1998 |
|---|---|---|
| JP | 2007-294864 A | 11/2007 |
| JP | 2009-260256 A | 11/2009 |

OTHER PUBLICATIONS

International Search Report (Form PCT/ISA/210) dated Oct. 28, 2014 and issued for International Application No. PCT/JP2014/069663.

*Primary Examiner* — Eric R Smith
(74) *Attorney, Agent, or Firm* — Volpe and Koenig, P.C.

(57) ABSTRACT

A thermoelectric module according to the present invention includes a first support substrate including a principal surface that includes a first region and a second region that is adjacent to the first region; a second support substrate including a principal surface that faces the first region; a plurality of thermoelectric elements arranged between the first region and the principal surface of the second support substrate; and a temperature detection element mounted in the second region. The temperature detection element and the second support substrate are thermally connected to each other by a thermally conductive member.

8 Claims, 7 Drawing Sheets

(56) References Cited

U.S. PATENT DOCUMENTS

| | | | | |
|---|---|---|---|---|
| 5,594,609 | A * | 1/1997 | Lin | H01L 35/325 |
| | | | | 136/225 |
| 6,084,172 | A * | 7/2000 | Kishi | H01L 35/00 |
| | | | | 136/200 |
| 7,122,896 | B2 * | 10/2006 | Saito | H01L 23/49816 |
| | | | | 228/180.22 |
| 2009/0189239 | A1 * | 7/2009 | Tokunaga | H01L 35/08 |
| | | | | 257/467 |
| 2010/0018222 | A1 * | 1/2010 | Tsuchida | H01L 35/32 |
| | | | | 62/3.7 |
| 2010/0031986 | A1 * | 2/2010 | Okamura | H01L 35/32 |
| | | | | 136/200 |
| 2012/0181434 | A1 * | 7/2012 | Sawada | G01T 1/2002 |
| | | | | 250/361 R |

* cited by examiner

THERMOELECTRIC MODULE

TECHNICAL FIELD

The present invention relates to thermoelectric modules used for temperature control or thermoelectric power generation, such as waste heat power generation, in, for example, thermostatic chambers, refrigerators, seat coolers for automobiles, semiconductor manufacturing devices, laser diodes, or fuel cells.

An example of a thermoelectric module is described in, for example, Japanese Unexamined Patent Application Publication No. 2007-294864 (hereinafter referred to as Patent Document 1). The thermoelectric module described in Patent Document 1 includes a first support substrate, a second support substrate that faces the first support substrate, and a plurality of thermoelectric elements disposed between the first support substrate and the second support substrate.

Thermoelectric modules are capable of generating a temperature difference between a support substrate and another support substrate when a voltage is applied to a plurality of thermoelectric elements. The thermoelectric modules are also capable of generating electric power with a plurality of thermoelectric elements when a temperature difference is applied between a support substrate and another support substrate. Owing to these characteristics, the thermoelectric modules are used, for example, for temperature control or thermoelectric power generation.

The thermoelectric module described in Patent Document 1 further includes a temperature detection element on the inner surface of the first support substrate (surface that faces the second support substrate). The temperature detection element detects the temperature of the first support substrate.

In the thermoelectric module described in Patent Document 1, since the temperature detection element is provided on the inner surface of the first support substrate, when the temperature of the first support substrate changes, the temperature change can be quickly detected. However, when the temperature of the second support substrate changes, since the heat of the second support substrate is transferred to the temperature detection element through the thermoelectric elements and the first support substrate, it takes a long time to detect the temperature change. As a result, when the thermoelectric module is used for temperature control, it takes a long time to control the temperature. When the thermoelectric module is used for thermoelectric power generation, it takes a long time to adjust the heat transferred to the thermoelectric module, and the power generation efficiency of the thermoelectric module may be reduced.

SUMMARY OF INVENTION

A thermoelectric module according to an aspect of the present invention includes a first support substrate including a principal surface that includes a first region and a second region that is adjacent to the first region; a second support substrate including a principal surface that faces the first region; a plurality of thermoelectric elements arranged between the first region and the principal surface of the second support substrate; and a temperature detection element mounted in the second region. The temperature detection element and the second support substrate are thermally connected to each other by a thermally conductive member.

DESCRIPTION OF EMBODIMENTS

A thermoelectric module 10 according to an embodiment of the present invention will be described in detail with reference to the drawings.

Figure 1:
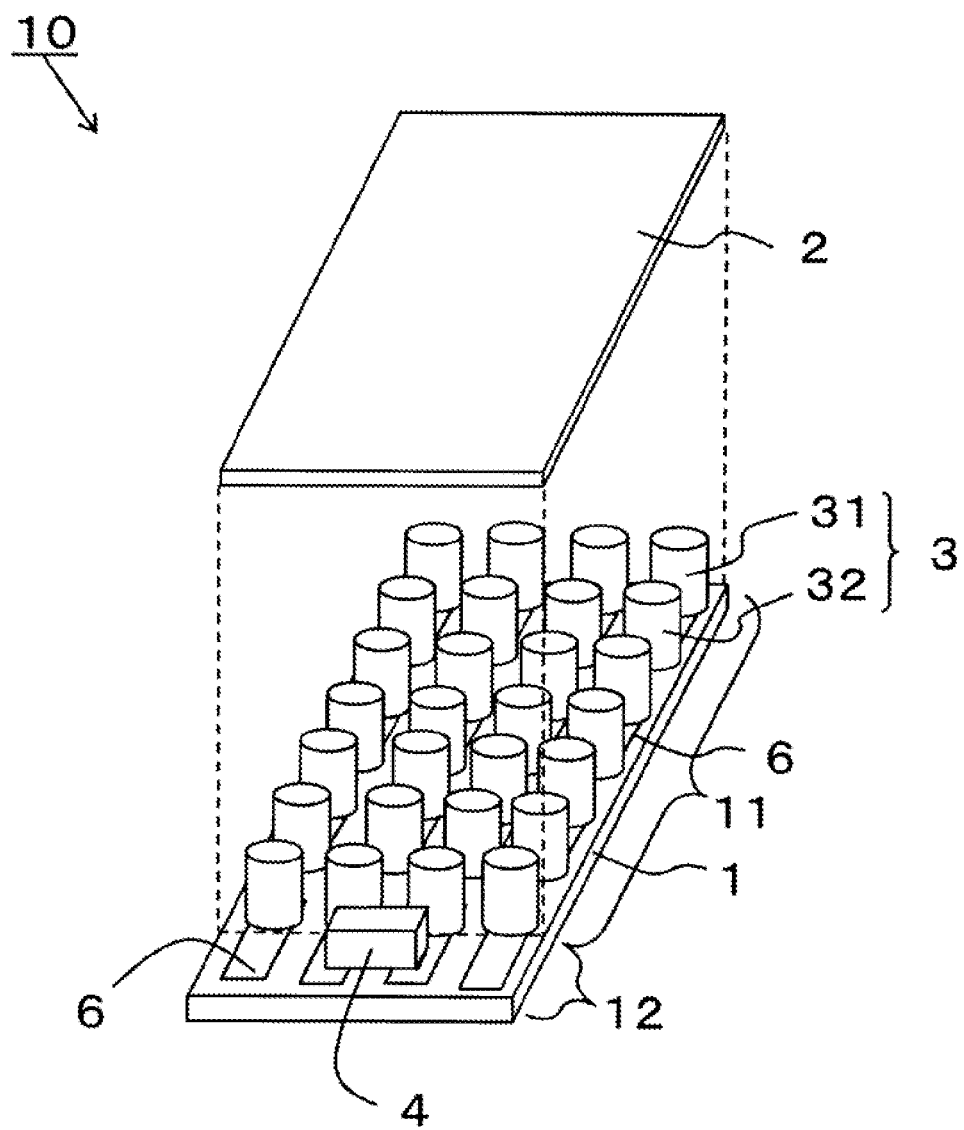
FIG. 1 is an exploded perspective view of a thermoelectric module according to an embodiment of the present invention.
Figure 2:
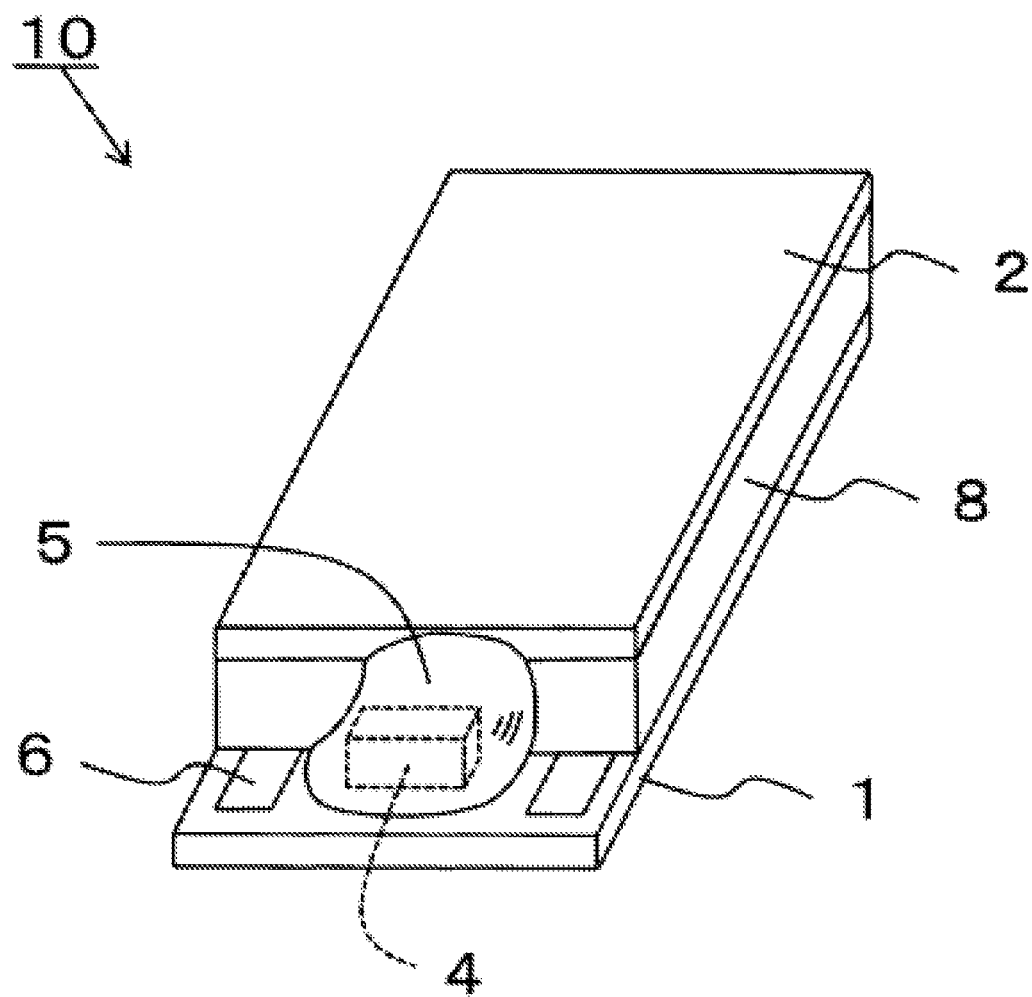
FIG. 2 is a perspective view of the thermoelectric module illustrated in FIG. 1.

As illustrated in FIG. 1, the thermoelectric module 10 according to the embodiment of the present invention includes a first support substrate 1, a second support substrate 2 that faces the first support substrate 1, thermoelectric elements 3 disposed between a principal surface of the first support substrate 1 and a principal surface of the second support substrate 2, and a temperature detection element 4 mounted on the first support substrate 1. In FIG. 1, the thermoelectric module 10 is shown in a partially exploded view for the convenience of description. Although not illustrated in FIG. 1, as illustrated in FIG. 2, the thermoelectric module 10 further includes a thermally conductive member 5 that thermally connects the temperature detection element 4 to the second support substrate 2 and a sealing member 8 that seals the thermoelectric elements 3. In FIG. 2, the thermally conductive member 5 is shown in a transparent view to clarify the positional relationship between the temperature detection element 4 and the thermally conductive member 5.

<Structure of First Support Substrate 1>

The first support substrate 1 is basically a component for supporting the thermoelectric elements 3 together with the second support substrate 2. As illustrated in FIG. 1, the first support substrate 1 is a rectangular member having a first region 11 and a second region 12, which is adjacent to the first support substrate 1, on the principal surface that faces the second support substrate 2 (hereinafter referred to also as a top surface). The first region 11 extends from an end of the first support substrate 1 over a major portion of the principal surface, and serves as a region in which the first support substrate 1 supports the thermoelectric elements 3 together with the second support substrate 2 that faces the first support substrate 1.

The second region 12 is a region of the first support substrate 1 excluding the first region 11, and is adjacent to the first region 11. The second region 12 is a region in which the temperature detection element 4 is provided.

With regard to the dimensions of the first support substrate 1 of the thermoelectric module 10 according to the present embodiment, the depth, width, and thickness may be set to, for example, 10 to 120 mm, 10 to 50 mm, and 0.1 to 5 mm, respectively.

A first electrode 6 is provided on the top surface of the first support substrate 1. Therefore, at least the top surface of the first support substrate 1 is made of an insulating material. The first support substrate 1 may be a substrate obtained by, for example, bonding a copper plate for transferring or radiating heat to the outside to a bottom principal surface of an epoxy resin plate to which alumina filler is added or a ceramic plate made of, for example, an aluminum oxide sintered body or an aluminum nitride sintered body. Alternatively, the first support substrate 1 may be a substrate obtained by providing an insulating layer made of an epoxy resin, a polyimide resin, an alumina ceramic, an aluminum nitride ceramic, or the like on the top surface of a copper plate, a silver plate, or a silver-palladium plate.

<Structure of First Electrode 6>

Figure 4:
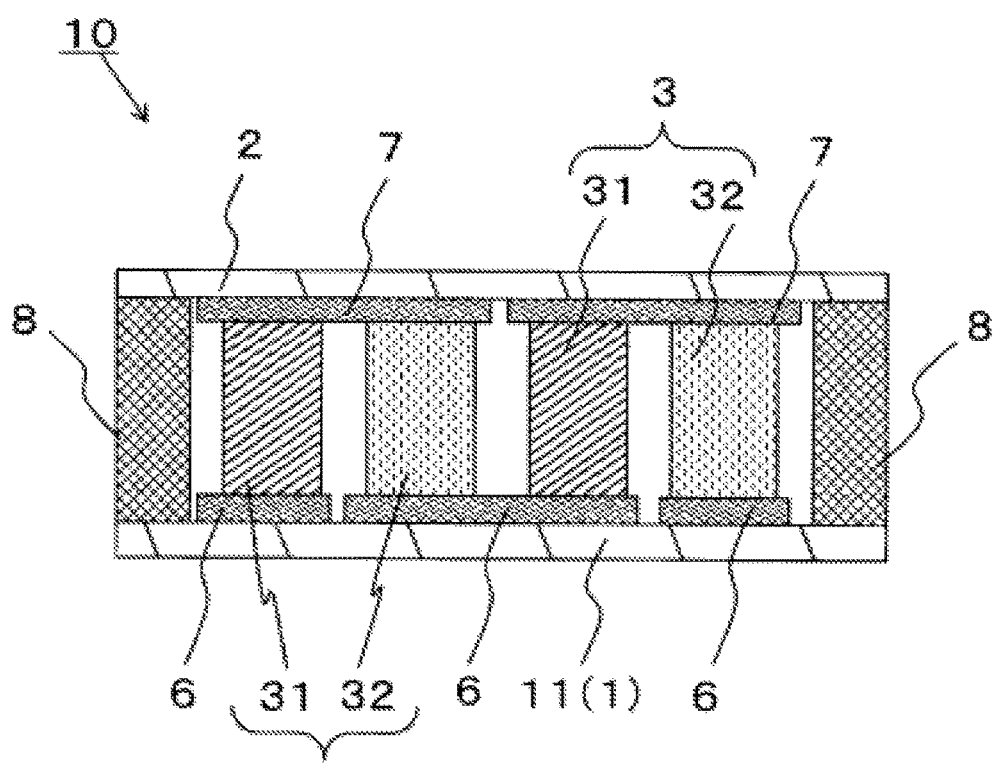
FIG. 4 is a sectional view of the thermoelectric module illustrated in FIG. 2 taken along line A-A'.

The first electrode 6 is a component for applying electric power to the thermoelectric elements 3 or extracting electric power generated by the thermoelectric elements 3. As illustrated in FIG. 4, the first electrode 6 is on the top surface of the first support substrate 1. The first electrode 6 electrically connects the thermoelectric elements 3 together with a second electrode on the bottom surface of the second support substrate 2. More specifically, p-type thermoelectric elements 31 and n-type thermoelectric elements 32, which are adjacent to each other, are alternately electrically connected in series, and all of the thermoelectric elements 3 are connected in series. The first electrode 6 is made of, for example, copper, silver, or silver-palladium. The first electrode 6 is formed by, for example, bonding a copper plate to the top surface of the first support substrate 1, placing a mask on the copper plate to cover regions corresponding to the first electrode 6, and removing, by etching, portions of the copper plate in regions other than the regions covered with the mask. The first electrode 6 may instead be formed by bonding a copper plate that is formed by a punching process and that has a shape corresponding to the shape of the first electrode 6 to the first support substrate 1.

<Structure of Second Support Substrate 2>

The second support substrate 2 is basically a component for supporting the thermoelectric elements 3 by sandwiching the thermoelectric elements 3 together with the first support substrate 1. The second support substrate 2 is arranged such that the principal surface thereof (hereinafter referred to also as a bottom surface) faces the first region 11 of the first support substrate 1. The bottom surface of the second support substrate 2 and the first region 11 of the top surface of the first support substrate 1 sandwich and support the thermoelectric elements 3. The second support substrate 2 has, for example, a rectangular shape. The dimensions of the second support substrate 2 are set such that the second support substrate 2 can support the thermoelectric elements 3 together with the first region 11 of the first support substrate 1. More specifically, when the second support substrate 2 has a rectangular shape, the depth, width, and thickness may be set to, for example, 8 to 100 mm, 10 to 50 mm, and 0.1 to 5 mm, respectively. In the thermoelectric module 10 according to the present embodiment, the principal surface of the second support substrate 2 and the first region 11 of the first support substrate 1 have the same shape and dimensions, and entirely overlap in plan view. Accordingly, the durability of the thermoelectric module 10 against a vertical force applied thereto is increased.

A second electrode 7 is provided on the principal surface (bottom surface) of the second support substrate 2 that faces the first support substrate 1. Therefore, at least the bottom surface of the second support substrate 2 is made of an insulating material. The second support substrate 2 may be composed of a member similar to the above-described member that can be used as the first support substrate 1.

<Structure of Second Electrode 7>

The second electrode 7 is a component for applying electric power to the thermoelectric elements 3 or extracting electric power generated by the thermoelectric elements 3. As illustrated in FIG. 4, the second electrode 7 is on the bottom surface of the second support substrate 2. The second electrode 7 electrically connects the thermoelectric elements 3 together with the first electrode 6. More specifically, the p-type thermoelectric elements 31 and the n-type thermoelectric elements 32, which are adjacent to each other, are alternately electrically connected in series, and all of the thermoelectric elements 3 are connected in series. The second electrode 7 is made of, for example, copper, silver, or silver-palladium. The second electrode 7 is formed by, for example, bonding a copper plate to the bottom surface of the second support substrate 2, placing a mask on the copper plate to cover regions corresponding to the second electrode 7, and etching portions of the copper plate in regions other than the regions covered with the mask. The second electrode 7 may instead be formed by bonding a copper plate that is formed by a punching process and that has a shape corresponding to the shape of the second electrode 7 to the bottom surface of the second support substrate 2.

<Structure of Thermoelectric Elements 3>

The thermoelectric elements 3 are components for performing temperature control by utilizing the Peltier effect or generating electric power by utilizing the Seebeck effect. The thermoelectric elements 3 are arranged between the first region 11 of the principal surface of the first support substrate 1 and the principal surface of the second support substrate 2. The thermoelectric elements 3 are arrayed with intervals therebetween, the intervals being 0.5 to 2 times the diameter of the thermoelectric elements 3. The thermoelectric elements 3 are bonded to the first electrode 6 with solder applied in a pattern similar to the pattern of the first electrode 6. All of the thermoelectric elements 3 are electrically connected in series by the first electrode 6 and the second electrode 7.

The thermoelectric elements 3 are classified into the p-type thermoelectric elements 31 and the n-type thermoelectric elements 32. The main portions of the thermoelectric elements 3 (p-type thermoelectric elements 31 and n-type thermoelectric elements 32) are formed of a thermoelectric material composed of $A_2B_3$-type crystal (A is Bi and/or Sb, and B is Te and/or Se), preferably, a Bi (bismuth)-based or Te (tellurium)-based thermoelectric material. More specifically, the p-type thermoelectric elements 31 are made of, for example, a thermoelectric material composed of a solid solution of $Bi_2Te_3$ (bismuth telluride) and $Sb_2Te_3$ (antimony telluride). The n-type thermoelectric elements 32 are made of, for example, a thermoelectric material composed of a solid solution of $Bi_2Te_3$ (bismuth telluride) and $Sb_2Se_3$ (antimony selenide).

The thermoelectric material of the p-type thermoelectric elements 31 is obtained by coagulating a p-type formation material, composed of bismuth, antimony, and tellurium that have been melted and then solidified, in a certain direction into a rod shape by the Bridgman method. The thermoelectric material of the n-type thermoelectric elements 32 is obtained by coagulating an n-type formation material, composed of bismuth, tellurium, and selenium that have been melted and then solidified, in a certain direction into a rod shape by the Bridgman method.

The rod-shaped thermoelectric materials are coated with a resist to prevent the side surfaces thereof from being plated, and are cut into pieces having a length of, for example, 0.3 to 5 mm with a wire saw. Then, a nickel layer and a tin layer are successively formed only on the cut surfaces by electroplating. Finally, the resist is removed with a solution. Thus, the thermoelectric elements 3 (p-type thermoelectric elements 31 and n-type thermoelectric elements 32) are obtained.

The thermoelectric elements 3 (p-type thermoelectric elements 31 and n-type thermoelectric elements 32) may have, for example, a columnar shape, a rectangular prism shape, or a polygonal prism shape. In particular, the thermoelectric elements 3 are preferably columnar shaped. In this case, the influence of thermal stress generated in the thermoelectric elements 3 in heat cycles can be reduced. In the case where the thermoelectric elements 3 are formed in a columnar shape, the dimensions thereof may be set such that, for example, the diameter is 1 to 3 mm.

<Structure of Temperature Detection Element 4>

Figure 3:
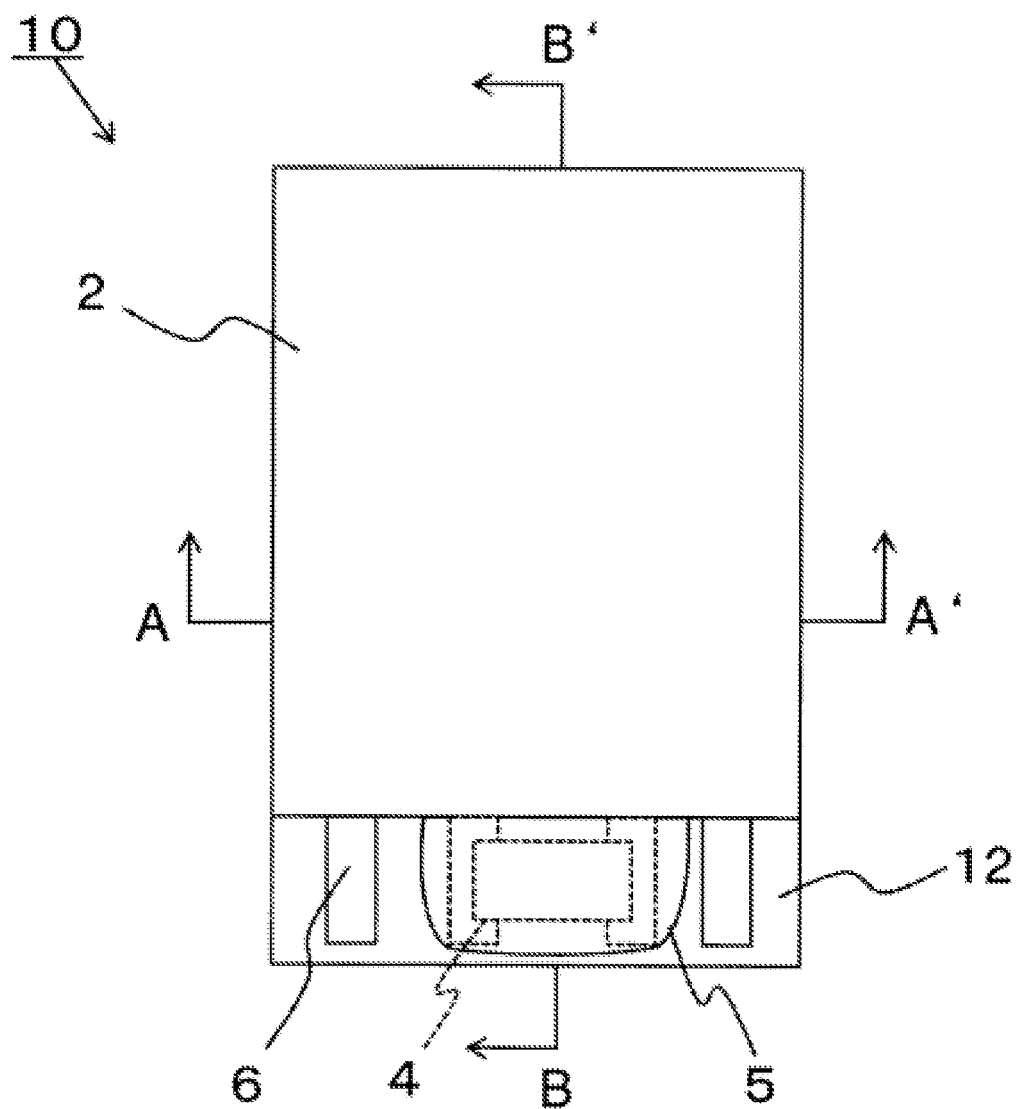
FIG. 3 is a plan view of the thermoelectric module illustrated in FIG. 1.
Figure 5:
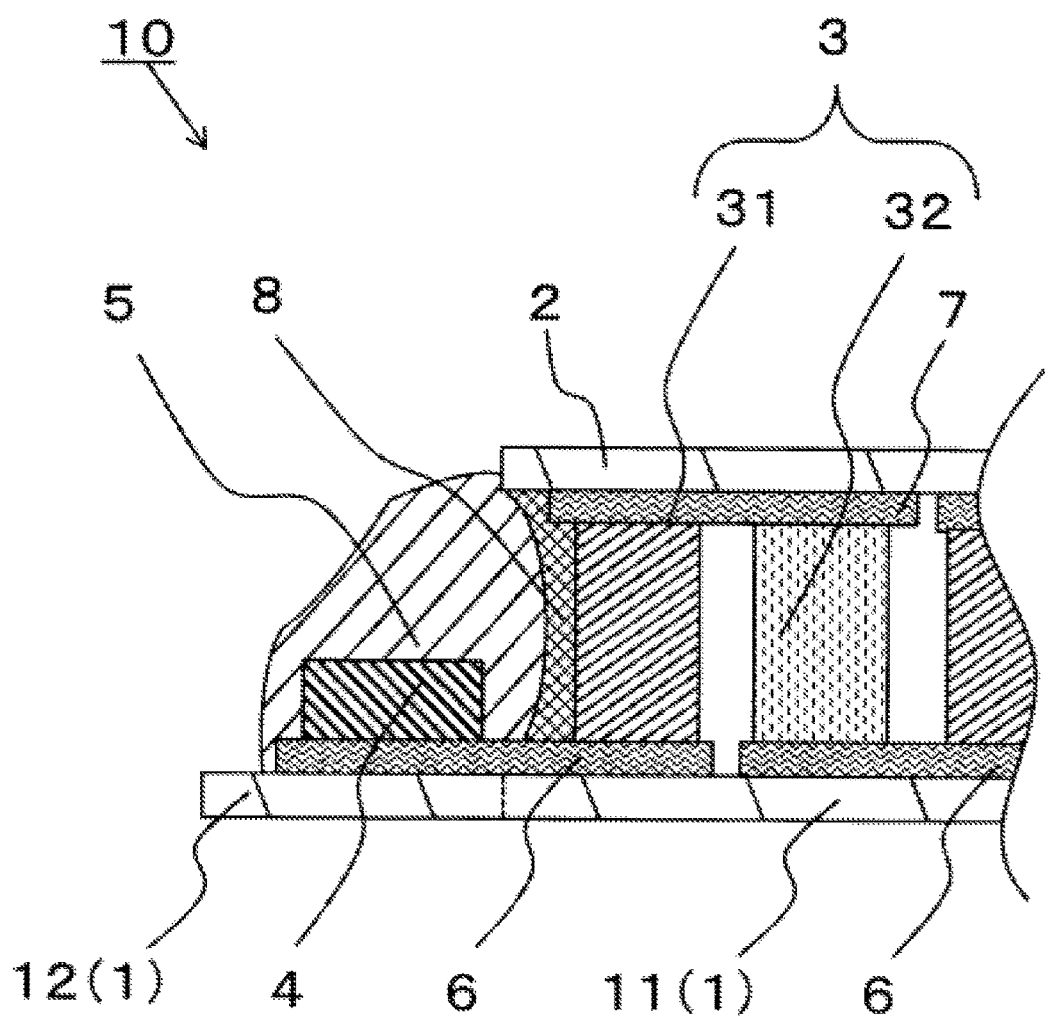
FIG. 5 is a partial sectional view of the thermoelectric module illustrated in FIG. 2 taken along line B-B'.

The temperature detection element 4 is a component for measuring the temperature of the thermoelectric module 10. As illustrated in FIGS. 3 and 5, the temperature detection element 4 is mounted on the ceramic body 1 in the second region 12. Since the temperature detection element 4 is in the second region 12, the temperature detection element 4 can be easily mounted even when the thickness thereof is greater than the distance between the top surface of the first support substrate 1 and the bottom surface of the second support substrate 2.

The temperature detection element 4 is, for example, a polymer-based PTC thermistor containing carbon particles. When the temperature becomes greater than or equal to a threshold, the temperature detection element 4 suddenly thermally expands. Accordingly, the polymer thermally expands and the inter-particle distance between the carbon particles increases, so that the electrical resistance increases. The temperature detection element 4 is electrically connected to the first electrode 6. The temperature detection element 4 includes an electrode portion that is bonded to the first electrode 6 with a solder material. In the present embodiment, the temperature detection element 4 is electrically connected to the thermoelectric elements 3 in series. In the case where the temperature detection element 4 has a rectangular parallelepiped shape, the dimensions of the temperature detection element 4 may be set such that the depth, width, and thickness are 0.5 to 5 mm, 1.5 to 8 mm, and 0.3 to 2 mm, respectively.

<Structure of Sealing Member 8>

The sealing member 8 is a component for airtightly sealing the thermoelectric elements 3 in the space between the first support substrate 1 and the second support substrate 2 that face each other. As illustrated in FIGS. 2, 4, and 5, the sealing member 8 is disposed between a peripheral portion of the first region 11 of the principal surface of the first support substrate 1 and the principal surface of the second support substrate 2. The sealing member 8 surrounds all of the thermoelectric elements 3. Namely, the sealing member 8 has an annular shape and is disposed between the first region 11 of the first support substrate 1 and the second support substrate 2. The sealing member 8 is made of, for example, a resin material such as an epoxy. The thickness of the sealing member 8 in a direction parallel to the principal surface of the first support substrate 1 may be set to, for example, about 0.5 to 2 mm. Since the sealing member 8 is provided, the environmental resistance of the thermoelectric elements 3 can be increased.

<Structure of Thermally Conductive Member 5>

The thermally conductive member 5 is a component for transferring heat of the second support substrate 2 to the temperature detection element 4. The temperature detection element 4 and the second support substrate 2 are thermally connected to each other by the thermally conductive member 5. As illustrated in FIGS. 2, 3 and 5, the thermally conductive member 5 covers the temperature detection element 4 and is in contact with the second support substrate 2. More specifically, the thermally conductive member 5 covers the entirety of the temperature detection element 4 and is in contact with a side surface of the second support substrate 2. The cross section of the thermally conductive member 5 in a direction parallel to the principal surface of the first support substrate 1 decreases from the first support substrate 1 toward the second support substrate 2. Herein, the "thermally connected" state means a state in which, since the thermally conductive member 5 is provided, heat is more easily transferred between the second support substrate 2 and the temperature detection element 4 than in the case where the thermally conductive member 5 is not provided.

The thermally conductive member 5 is formed of a member that has a high thermal conductivity and that is highly adhesive to the second support substrate 2 and the temperature detection element 4. The thermally conductive member 5 is made of, for example, a resin material such as an epoxy resin or a silicone resin. In the case where a resin material is used as the material of the thermally conductive member 5, the thermally conductive member 5 may be formed by supplying the material to a region around the temperature detection element 4 with a dispenser or the like, and then curing the material with heat or moisture. When a silicone resin is used as the material of the thermally conductive member 5, the thermal conductivity may be set to about 4 W/(m·K).

The thermally conductive member 5 is preferably formed of a resin material and thermally conductive particles having a thermal conductivity higher than that of the resin material. More specifically, when a silicone material is used as the resin material, particles of a metal, such as SnSb, having a high thermal conductivity may be dispersed in the silicone resin as the thermally conductive particles. In such a case, the thermal conductivity can be further increased while the adhesiveness of the thermally conductive member 5 is maintained. In particular, when the above-described metal particles are densely distributed in a region around the temperature detection element 4, heat can be easily transferred to the temperature detection element 4.

In the thermoelectric module 10 according to the present embodiment, the temperature detection element 4 and the second support substrate 2 are thermally connected to each other by the thermally conductive member 5. Therefore, a temperature change can be quickly detected not only when the temperature of the first support substrate 1 has changed but also when the temperature of the second support substrate 2 has changed. As a result, when the thermoelectric module 10 is used for temperature control, the time required for the temperature control can be reduced. When the thermoelectric module 10 is used for thermoelectric power generation, the heat transferred to the thermoelectric module 10 can be quickly adjusted, so that the reduction in the power generation efficiency of the thermoelectric module 10 can be suppressed.

In addition, in the thermoelectric module 10 according to the present embodiment, the sealing member 8 is disposed between the peripheral portion of the first region 11 and the principal surface of the second support substrate 2 so as to surround the thermoelectric elements 3, and the thermally conductive member 5 is in contact with the sealing member 8. In general, when the thermoelectric module 10 is used, a temperature difference occurs between the first support substrate 1 and the second support substrate 2. Therefore, the thermoelectric elements 3 and the sealing member 8, which are disposed between the first support substrate 1 and the second support substrate 2, try to deform into a distorted shape. Since the sealing member 8 and the thermally conductive member 5 are in contact with each other, deformation of a portion of the sealing member 8 that is in contact with the thermally conductive member 5 can be suppressed. Since the deformation of the sealing member 8 is suppressed, the long-term reliability of the thermoelectric module 10 can be increased.

In addition, in the thermoelectric module 10 according to the present embodiment, the contact surface between the thermally conductive member 5 and the sealing member 8 is curved. Accordingly, even when a thermal stress is generated between the sealing member 8 and the thermally conductive member 5, since the area of the contact surface is greater than that in the case where the contact surface is flat, the generated thermal stress can be distributed over a large area. Thus, the sealing member 8 and the thermally conductive member 5 are deformed by a small amount over a large area, so that the deformation of the sealing member 8 can be suppressed and the thermal stress can be absorbed. As a result, the long-term reliability of the thermoelectric module 10 can be increased.

In addition, in the thermoelectric module 10 according to the present embodiment, the above-described contact surface is a curved surface that is concave toward the sealing member 8. More specifically, the contact surface has an arc shape that is concave toward the sealing member 8 in cross section. The depth of the concavely curved surface may be set to, for example, about 0.3 to 1.5 mm. The temperature detection element 4, which is composed of a PTC thermistor, has characteristics such that it expands when the temperature becomes greater than or equal to the threshold. When the temperature detection element 4 thermally expands, the thermally conductive member 5, which covers the temperature detection element 4, also deforms. Since the contact surface between the thermally conductive member 5 and the sealing member 8 is concave toward the sealing member 8, local concentration of the thermal stress on the contact surface between the thermally conductive member 5 and the sealing member 8 can be suppressed. As a result, the long-term reliability of the thermoelectric module 10 can be increased.

The thermally conductive member 5 preferably has a modulus of elasticity higher than that of the sealing member 8. In such a case, when the sealing member 8 tries to deform, the deformation can be suppressed by the thermally conductive member 5. As a result, deformation of the thermoelectric module 10 can be suppressed in heat cycles. The modulus of elasticity of the thermally conductive member 5 may be set to, for example, about 4 MPa, and the modulus of elasticity of the sealing member 8 may be set to, for example, about 1.7 MPa.

Although the first support substrate 1 and the second support substrate 2 both have a rectangular shape in the thermoelectric module 10 according to the present embodiment, their shapes are not limited to this. The shapes of the first support substrate 1 and the second support substrate 2 may be changed as appropriate in accordance with the structure of an external member to which the thermoelectric module 10 is attached. More specifically, the first support substrate 1 and the second support substrate may have a polygonal shape other than a rectangular shape, a circular shape, or an elliptical shape.

Figure 6:
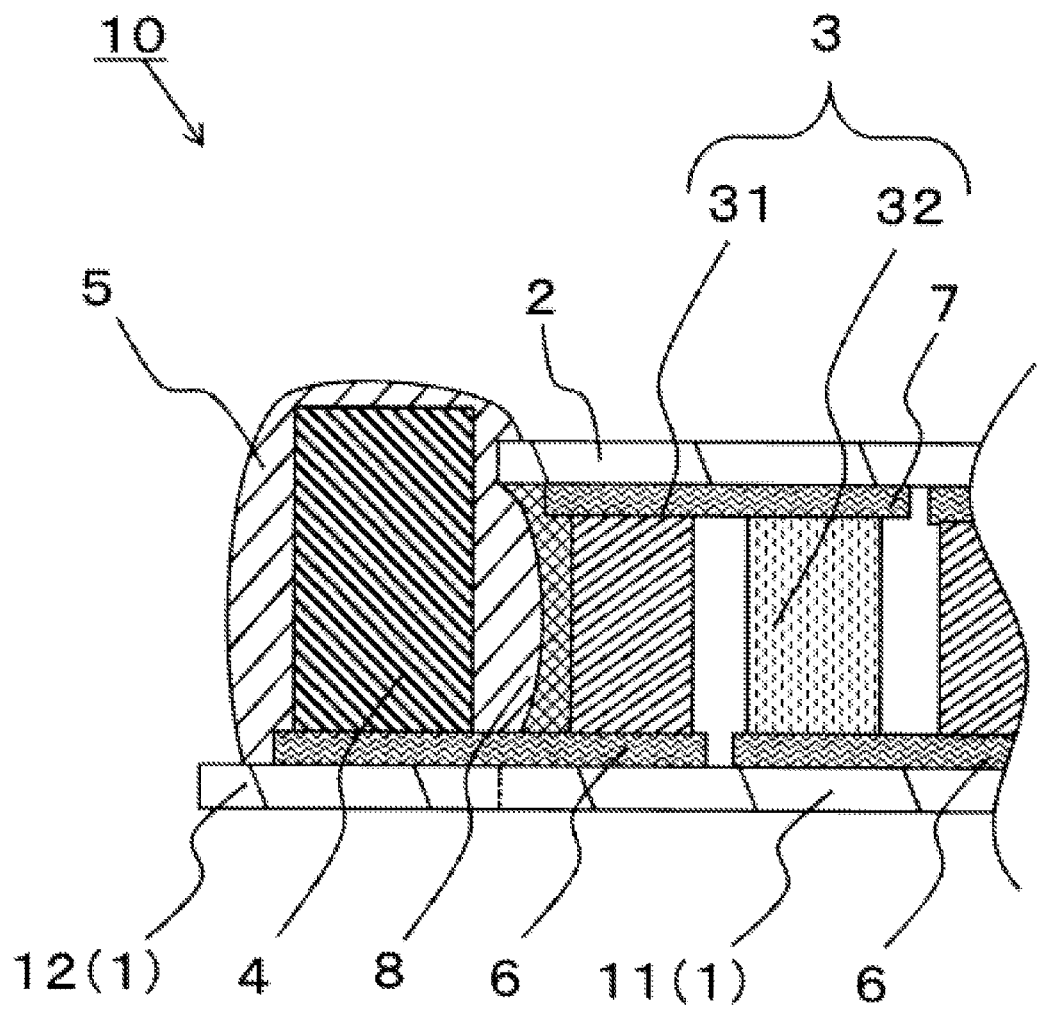
FIG. 6 is a partial sectional view of a thermoelectric module according to a first modification of the present invention.

As illustrated in FIG. 6, the temperature detection element 4 may have a top surface, and the top surface of the temperature detection element 4 may be located above the bottom surface of the second support substrate 2. When the top surface of the temperature detection element 4 is located above the bottom surface of the second support substrate 2, a side surface of the second support substrate 2 may be disposed near a side surface of the temperature detection element 4. Accordingly, heat can be more quickly transferred between the temperature detection element 4 and the second support substrate 2. The vertical distance between the top surface of the temperature detection element 4 and the bottom surface of the second support substrate 2 may be set to, for example, about 0.1 to 3 mm.

Figure 7:
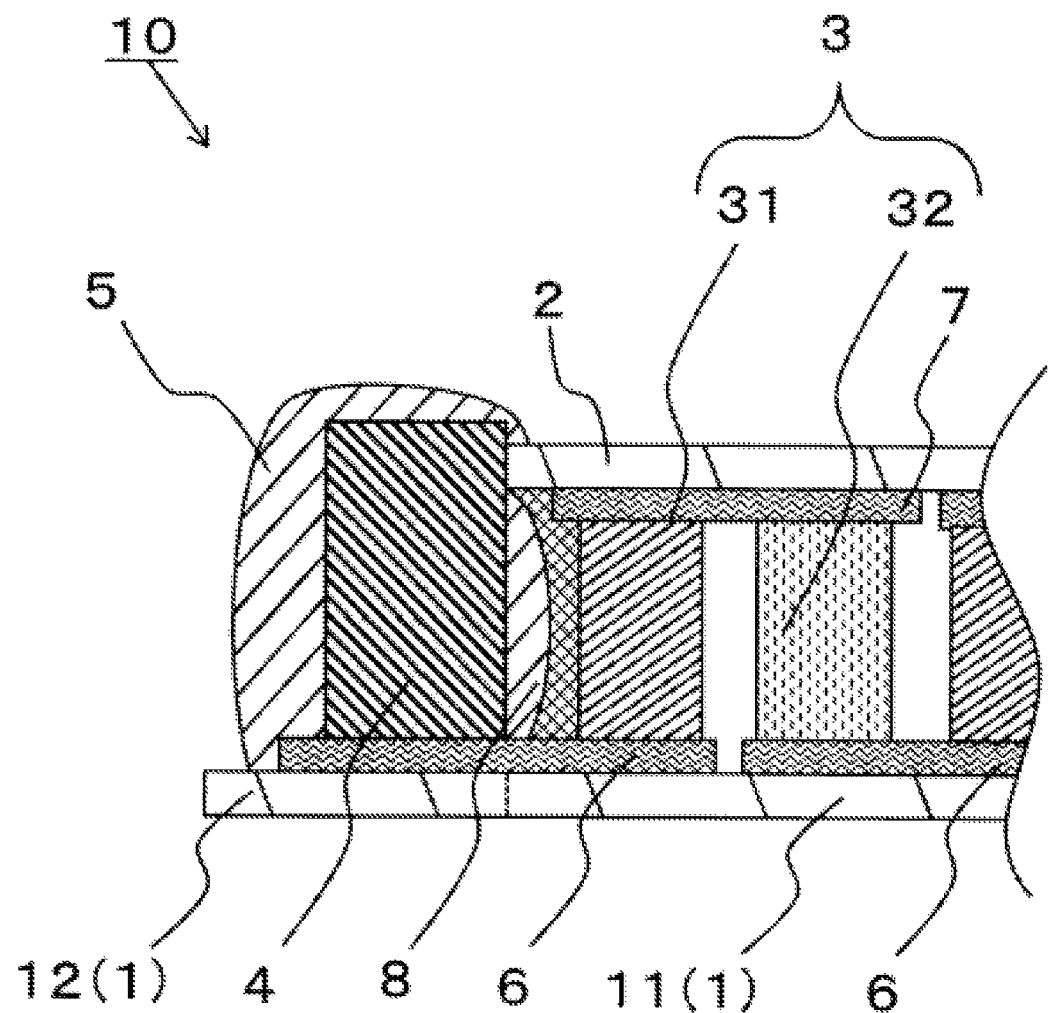
FIG. 7 is a partial sectional view of a thermoelectric module according a second modification of the present invention.

As illustrated in FIG. 7, in addition to the temperature detection element 4 and the second support substrate 2 being thermally connected to each other by the thermally conductive member 5, the temperature detection element 4 and the second support substrate 2 may be in contact with each other. In such a case, heat can not only be transferred from the second support substrate 2 to the temperature detection element 4 through the thermally conductive member 5, but also be directly transferred from the second support substrate 2 to the temperature detection element 4. As a result, heat can be more quickly transferred between the temperature detection element 4 and the second support substrate 2. Preferably, a side surface of the temperature detection element 4 and a side surface of the second support substrate 2 are in surface contact with each other. In such a case, the contact area between the temperature detection element 4 and the second support substrate 2 can be increased, so that heat can be more quickly transferred between the temperature detection element 4 and the second support substrate 2.

Examples

The thermoelectric module 10 according to the present invention will be described in further detail by referring to examples. First, the first support substrate 1 having the first electrode 6 on the top surface thereof and the second support substrate 2 having the second electrode 7 on the bottom surface thereof were prepared, and the thermoelectric elements 3 were arranged between the first support substrate 1 and the second support substrate 2. A substrate obtained by bonding a copper plate to the bottom surface of an epoxy resin plate to which alumina filler was added was used as the first support substrate 1. Similarly, a substrate obtained by bonding a copper plate to the top surface of an epoxy resin plate to which alumina filler was added was used as the second support substrate 2. The thickness of each epoxy resin plate was 80 μm, and the thickness of each copper plate was 120 μm. The first electrode 6 and the second electrode 7 were made of copper. The thickness of the copper was 105 μm.

The thermoelectric elements 3 were arranged between the first region 11 of the first support substrate 1 and the second support substrate 2, and were bonded to the first electrode 6 and the second electrode 7. The thermoelectric elements 3 had a columnar shape with a diameter of 1.8 mm and a height of 1.6 mm. The thermoelectric elements 3 were bonded to the first electrode 6 and the second electrode 7 with solder.

Next, the sealing member 8 was provided so as to surround the thermoelectric elements 3 in the space between the first region 11 of the first support substrate 1 and the second support substrate 2. An epoxy resin was used as the sealing member 8.

The temperature detection element 4 was provided on the top surface of the first support substrate 1 in the second region 12, which is a region outside the sealing member 8.

A PTC thermistor was used as the temperature detection element 4. Then, the thermally conductive member 5 was arranged such that the thermally conductive member 5 was in contact with both the temperature detection element 4 and the second support substrate 2, so that the temperature detection element 4 and the second support substrate 2 were thermally connected to each other. A silicone resin was used as the thermally conductive member 5. Thus, an example of the thermoelectric module 10 according to the present invention (Sample 1) was manufactured. As a comparative example, a thermoelectric module without the thermally conductive member 5 (Sample 2) was also produced.

Next, Samples 1 and 2 were evaluated. To simulate a case where abnormal heating has occurred at a side of the thermoelectric elements 3 adjacent to the second support substrate 2, a heater was attached to the top surface of the second support substrate 2. Next, the heater was caused to generate heat so that the second support substrate 2 was heated, and the time required for the temperature detection element 4 to detect the temperature change was measured. More specifically, the temperature of the heater was increased from a normal temperature (20° C.) to 90° C. in 5 seconds. It was assumed that the temperature detection element 4 detected the temperature change when the electrical resistance of the temperature detection element 4 increased by 5%. The time from when the heater started to increase the temperature to when the temperature detection element 4 detected the temperature change was measured. The time from when the heater started to increase the temperature to when the temperature change was detected was 8 seconds for Sample 1, and 17 seconds for Sample 2. It has been confirmed from the above-described results that, by providing the thermally conductive member 5 that thermally connects the temperature detection element 4 and the second support substrate 2 to each other, even when the temperature of the second support substrate 2 is changed, the temperature change can be can be quickly detected.

REFERENCE SIGNS LIST

1 first support substrate
11 first region
12 second region
2 second support substrate
3 thermoelectric element
31 p-type thermoelectric element
32 n-type thermoelectric element
4 temperature detection element
5 thermally conductive member
6 first electrode
7 second electrode
8 sealing member
10 thermoelectric module

The invention claimed is:

1. A thermoelectric module comprising:
a first support substrate;
a second support substrate that overlays a first region of the first support substrate;
a plurality of thermoelectric elements arranged in the first region between the first support substrate and the second support substrate;
a temperature detection element mounted in a second region of the first support substrate that is not overlaid by the second support substrate; and
a thermally conductive member extending continuously between and physically contacting both the first support substrate and the second support substrate,
wherein the temperature detection element is thermally connected to the second support substrate by the thermally conductive member.

2. The thermoelectric module according to claim 1, wherein a sealing member is disposed between the first region and the second support substrate, the sealing member surrounding the thermoelectric elements, and the thermally conductive member is in contact with the sealing member.

3. The thermoelectric module according to claim 2, wherein a contact surface between the thermally conductive member and the sealing member is a curved surface.

4. The thermoelectric module according to claim 3, wherein the contact surface is concave toward the sealing member.

5. The thermoelectric module according to claim 2, wherein the thermally conductive member has a higher modulus of elasticity than that of the sealing member.

6. The thermoelectric module according to claim 1, wherein the thermally conductive member contains a resin material and thermally conductive particles having a higher thermal conductivity higher than that of the resin material.

7. The thermoelectric module according to claim 1, wherein: a thickness of the temperature detection element is larger than a distance between a top surface of the first support substrate and a bottom surface of the second support substrate; and
a top surface of the temperature detection element is located above a bottom surface of the second support substrate.

8. The thermoelectric module according to claim 1, wherein the temperature detection element is in contact with a side surface of the second support substrate.

* * * * *